United States Patent [19]

Robinson et al.

[11] 4,430,361

[45] Feb. 7, 1984

[54] APPARATUS AND METHOD FOR PREPARING AN ABRASIVE COATED SUBSTRATE

[75] Inventors: John W. Robinson, Levittown, Pa.; Grzegorz Kaganowicz, Belle Mead, N.J.

[73] Assignee: RCA Corporation, New York, N.Y.

[21] Appl. No.: 463,288

[22] Filed: Feb. 2, 1983

[51] Int. Cl.³ ............................................. B05D 3/06
[52] U.S. Cl. ....................................... 427/39; 427/40; 427/41
[58] Field of Search .............................. 427/40, 41, 39

[56] References Cited

U.S. PATENT DOCUMENTS

| | | |
|---|---|---|
| 3,310,424 | 3/1967 | Wehner et al. |
| 3,485,666 | 12/1969 | Sterling et al. ........................ 427/39 |
| 4,096,315 | 6/1978 | Kubacki ............................... 427/41 |
| 4,260,647 | 4/1981 | Wang et al. .......................... 427/40 |
| 4,328,646 | 5/1982 | Kaganowicz ....................... 51/281 R |
| 4,355,052 | 10/1982 | Kaganowicz et al. ................ 427/39 |
| 4,361,595 | 11/1982 | Kaganowicz et al. ................ 427/39 |

Primary Examiner—John H. Newsome
Attorney, Agent, or Firm—Birgit E. Morris; Theodore R. Furman

[57] ABSTRACT

An improved method of preparing a coating by subjecting gaseous precursors to a glow discharge and an apparatus suitable for carrying out such a method are disclosed. The improvement includes mounting a substrate onto a plate of ferromagnetic material which enhances the deposition rate of the coating within the electrode area.

7 Claims, 2 Drawing Figures

APPARATUS AND METHOD FOR PREPARING AN ABRASIVE COATED SUBSTRATE

This invention relates to a method for preparing a coating by glow discharge and an apparatus for carrying out the method. More particularly, this invention relates to a method for preparing an abrasive silicon oxide coating and an apparatus suitable for use in such a method.

BACKGROUND OF THE INVENTION

Kaganowicz, in U.S. Pat. No. 4,328,646, disclosed a method for preparing an abrasive silicon oxide coating on a substrate such as a grooved disc which includes the steps of subjecting silane ($SiH_4$) and a gaseous, oxygen-containing compound selected from the group consisting of $N_2O$, $H_2O$, and $CO_2$ to a glow discharge. The resulting silicon oxide ($SiO_x$) coatings are suitable for lapping a hard material, such as diamond. Further studies of these silicon oxide coatings, as disclosed by Kaganowicz et al in U.S. Pat. No. 4,355,052, have illustrated a correlation between the refractive index and the lapping capabilities of the $SiO_x$ coating. Coatings with a refractive index between 1.1 and 1.4, for example, have provided enhanced lapping of diamond articles.

In order to use the above-mentioned methods to obtain reproducible coatings, a reasonable degree of control is needed over the "glow". It is felt that peripheral deposition, i.e., silicon oxide deposited outside the electrode area, has a detrimental effect on controlling the glow and therefore the uniformity of the coating, as well. Magnetically enhanced glow discharge systems have been employed in which magnets, behind, but electrically insulated from, the electrodes help hold the glow in the vicinity of the electrodes for a more efficient reaction of the various precursors within the glow. Even this innovation, however, has not totally eliminated all of the peripheral deposition. It is believed that a higher rate of deposition within the electrode area would further reduce peripheral deposition in magnetically enhanced glow discharge systems simply by reducing the volume of precursors which could diffuse out of the electrode area. A higher rate of deposition would also be desirable for high volume production purposes. Therefore, a method which provides increased deposition of $SiO_x$ in the electrode area and an apparatus suitable for carrying out such a method have been sought.

SUMMARY OF THE INVENTION

An improved method of preparing a coating by subjecting gaseous precursors to a glow discharge and an apparatus for carrying out such a method is disclosed. The improvement includes mounting a substrate on a plate of ferromagnetic material which enhances the deposition rate of the coating within the electrode area.

DETAILED DESCRIPTION OF THE INVENTION

Figure 1:
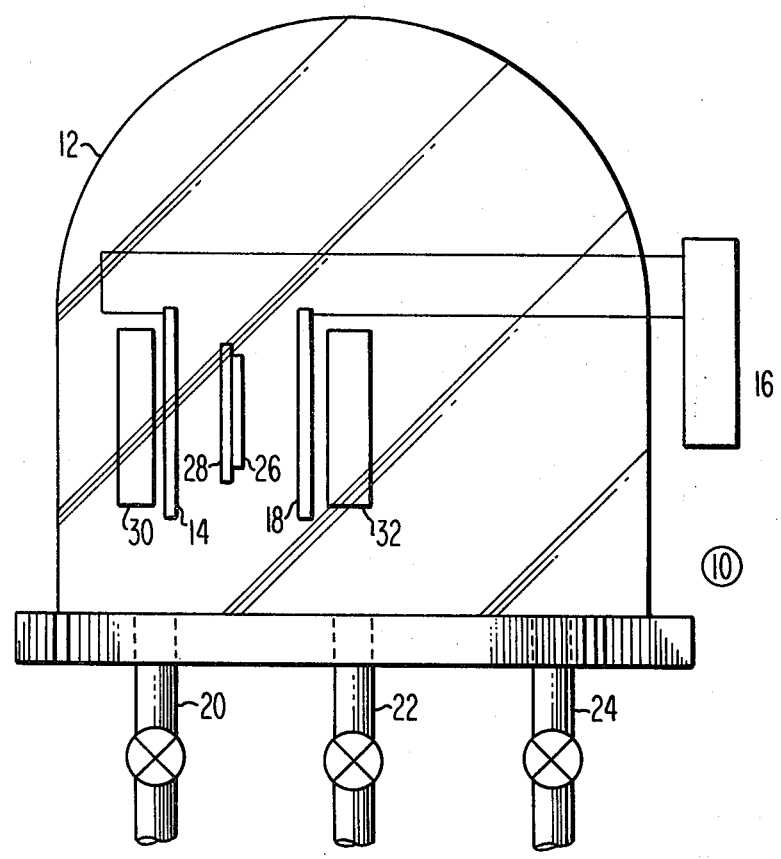
FIG. 1 is a cross-sectional view of an apparatus suitable for depositing the $SiO_x$ coating according to the present invention.

A glow discharge apparatus suitable for preparing the abrasive material is shown in FIG. 1 generally as 10. The glow discharge apparatus 10 includes a vacuum chamber 12 which can be a glass bell jar. In the vacuum chamber 12 are two electrodes 14 and 18 which can be a screen, coil or plate of a material that is a good electrical conductor and does not readily sputter, such as aluminum. The electrodes 14 and 18 are connected to a power supply 16, which may be DC or AC, to produce a voltage potential. Behind the electrodes 14 and 18 are magnets 30 and 32. These magnets 30 and 32 are typically electrically insulated from the electrodes 14 and 18. An outlet 20 from the vacuum chamber 12 allows for evacuation of the system and is connected to a pumping station, not shown. A first inlet 22 and a second inlet 24 are connected to gas bleed systems, not shown, for adding the reactants employed to prepare the abrasive material.

In carrying out the process, a substrate 26 to be coated, which overlies a ferromagnetic plate 28, is placed between the electrodes 14 and 18, typically maintained about 5 to 15 centimeters apart. The vacuum chamber 12 is then evacuated through the outlet 20 to a pressure of about 0.5 to $1 \times 10^{-5}$ Torr. A gas such as $N_2O$ is added through a first inlet 22 to its desired partial pressure. $SiH_4$ is added through a second inlet 24 until the desired partial pressure ratio of $SiH_4$ to $N_2O$ is obtained.

In order to begin deposition of an abrasive coating on the substrate 26, a glow discharge is initiated between the electrodes 14 and 18 by energizing the power source 16. For deposition the current should be in the range of about 200 to 900 milliamps, preferably about 400 to 700 milliamps. Any convenient frequency may be employed. The potential between electrodes 14 and 18 is generally about 1,000 volts. The magnets 30 and 32, along with the energized electrodes 14 and 18 create, an electromagnetic field which keeps the glow in the vicinity of the electrodes 14 and 18 for a more efficient reaction of the precursors.

Figure 2:
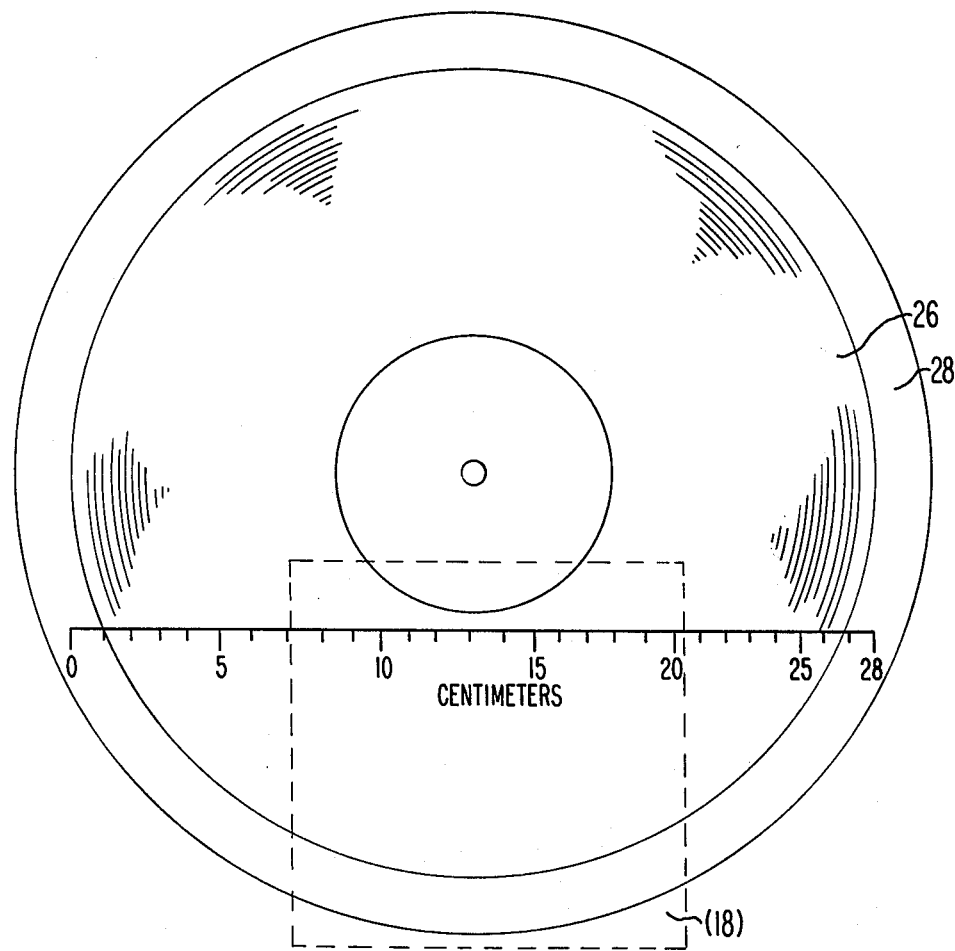
FIG. 2 is a lateral view of a stationary test disc used for measuring the deposition rates inside the electrode area.

In the past, great care had been taken to avoid using any materials in hardware or fixtures that would disturb this electromagnetic field. Surprisingly however, it has been found that the silicon oxide deposition rate within the electrode area increases by placing the ferromagnetic plate 28 behind the lapping disc substrate 26 during deposition. FIG. 2 is a lateral view showing a stationary test disc used to measure the thickness of material deposited inside the electrode area (dotted lines indicate electrode area).

The invention will be further illustrated by the following Example, but it is to be understood that the invention is not meant to be limited to the details described therein.

EXAMPLE 1

A 30.5 centimeter diameter poly(vinyl chloride) test disc coated with a metal bi-layer comprising a copper layer about 50 Angstroms thick and a 200 Angstrom thick layer of Inconel 600 (79.0 percent by weight of nickel, 13.8 percent by weight of chromium and 8.33 percent by weight of iron) was placed in a 46 centimeter by 76 centimeter bell jar as shown in FIG. 1. The disc substrate was mounted with a cold-rolled steel 35 cm diameter backing plate between two 15 centimeter by 15 centimeter aluminum electrodes. These electrodes covered a strip approximately 12 centimeters wide on the disc. The bell jar was then evacuated to a pressure of $1 \times 10^{-5}$ Torr. $N_2O$ was added to a partial pressure of 32 micrometers of mercury using a flow rate as estimated by nitrogen flow of 23.6 standard cubic centimeters per minute (sccm). $SiH_4$ was then added to a partial pressure of 4.5 micrometers at a flow rate of 4.3 sccm.

To create a glow between the electrodes, 500 milliamps of current were supplied to the electrodes with a potential of about 1,000 volts at 10 kilohertz for 10 minutes. The rates of deposition for various positions within the electrode area shown in FIG. 2 were measured. The results are averaged in Table 1.

CONTROL 1

A second 30.5 centimeter PVC test disc was coated as above except that no ferromagnetic backing plate was used. The rates of deposition were measured and the averaged results follow in Table 1.

TABLE 1

|  | Average Rage of Deposition (within electrode area) |
|---|---|
| Example 1 | 150 Å/minute |
| Control 1 | 106 Å/minute |

What is claimed is:

1. In a method for preparing a coating in a magnetically enhanced glow discharge apparatus, comprising subjecting gaseous precursors to a glow discharge and depositing the coating onto a substrate;
   the improvement comprising mounting said substrate onto a ferromagnetic backing plate whereby the rate of deposition of said coating in the electrode area is increased.

2. A method in accordance with claim 1 wherein the ferromagnetic backing plate consists of cold-rolled steel.

3. In a method for preparing an abrasive $SiO_x$ coating wherein $1 \leq X \leq 2$, comprising subjecting silane and a gaseous oxygen containing compound selected from the group consisting of $N_2O$, $CO_2$ and $H_2O$ to a glow discharge and depositing the $SiO_x$ product onto a substrate;
   the improvement comprising mounting said substrate onto a ferromagnetic backing plate whereby the rate of deposition of said $SiO_x$ material in the electrode area is increased.

4. A method in accordance with claim 3 wherein deposition is continued until the $SiO_x$ thickness is at least about 250 Angstroms.

5. A method in accordance with claim 1 wherein the substrate is a polymer of vinyl chloride.

6. In a magnetically enhanced glow discharge apparatus for use in coating a substrate which apparatus comprises
   a vacuum chamber;
   one or more electrodes within said chamber connected to a power source for energizing said electrodes;
   magnets behind, but electrically insulated from, said electrodes;
   outlet means for evacuating said chamber;
   inlet means for introducing appropriate precursors into said vacuum chamber; and
   means for holding the substrate between, but not in contact with said electrodes;
   the improvement comprising mounting said substrate onto a ferromagnetic backing plate, whereby the rate of deposition of the coating onto the substrate within the electrode area is increased.

7. The apparatus according to claim 5 wherein the ferromagnetic backing plate consists of cold-rolled steel.

* * * * *